(12) United States Patent
Schrögmeier et al.

(10) Patent No.: US 6,404,699 B1
(45) Date of Patent: Jun. 11, 2002

(54) INTEGRATED CIRCUIT HAVING A COMMAND DECODER

(75) Inventors: Peter Schrögmeier, München; Stefan Dietrich, Türkenfeld; Sabine Schöniger, Miesbach; Christian Weis, München, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/603,742

(22) Filed: Jun. 26, 2000

(30) Foreign Application Priority Data

Jun. 25, 1999 (DE) .......................... 199 29 174

(51) Int. Cl.$^7$ ................................ G11C 8/00
(52) U.S. Cl. ................... 365/230.06; 365/193
(58) Field of Search ............. 365/230.06, 233, 365/189.05, 193

(56) References Cited

U.S. PATENT DOCUMENTS 5,703,831 A    12/1997  Sawada
5,781,496 A     7/1998  Pinkham et al.
5,881,016 A  *  3/1999  Kenkare et al. ....... 365/230.03
5,986,945 A  * 11/1999  Zheng .................. 365/189.05
6,026,496 A  *  2/2000  Wright et al. ................ 713/500

\* cited by examiner

*Primary Examiner*—David Nelms
*Assistant Examiner*—Thong Le
(74) *Attorney, Agent, or Firm*—Herbert L. Lerner; Laurence A. Greenberg; Werner H. Stemer

(57) ABSTRACT

The integrated circuit has an activation decoder whose outputs are connected to the inputs of a command decoder. When an activation signal is at a first logic level, the activation decoder produces at its outputs a command supplied to it from command inputs. When the activation signal is at a second logic level, the activation decoder produces a deactivation command at its outputs irrespective of the command supplied to it from the command inputs. The command decoder does not activate any of its outputs when the deactivation command is being supplied to its inputs. The command decoder activates one of its outputs in each case when a different command is supplied to its inputs.

3 Claims, 1 Drawing Sheet

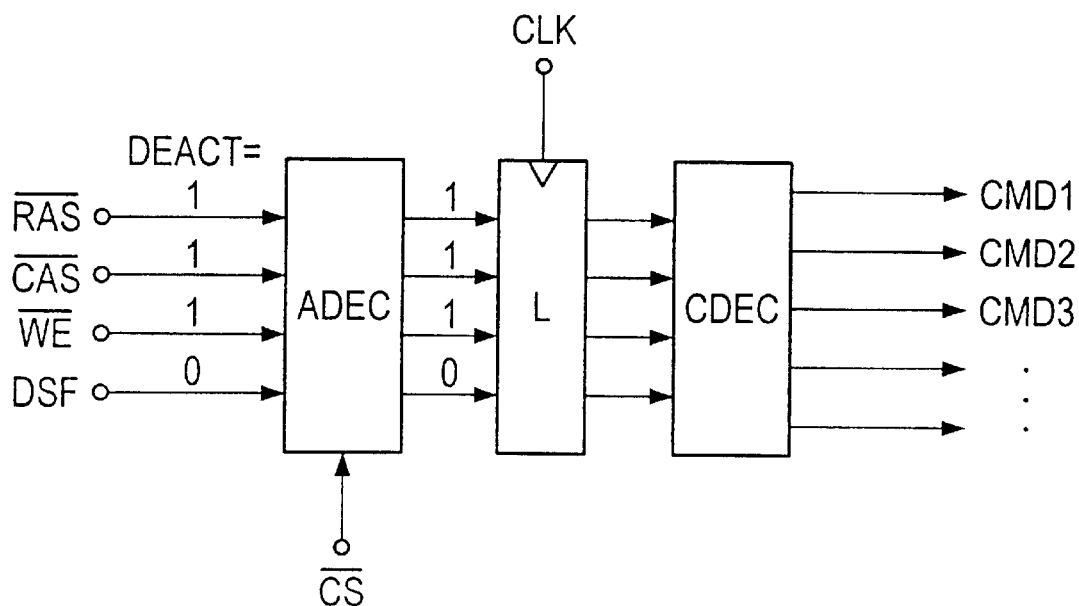

INTEGRATED CIRCUIT HAVING A COMMAND DECODER

BACKGROUND OF THE INVENTION

Field of the Invention

The invention lies in the integrated technology field. More specifically, the invention relates to an integrated circuit having a command decoder.

According to the JEDEC specification, SGRAMs (Synchronous Graphic Random Access Memories) have internal command signals which can be activated by digital external commands. For that purpose, an SGRAM has a command decoder to which the bits of the commands are in each case supplied in parallel, and which decodes the internal command signals from the commands. In the case of SGRAMs, the commands have a length of 5 bits. SDRAMs (Synchronous Dynamic Random Access Memories) also have such command decoders. The commands supplied to them have a length of 4 bits.

In both SGRAMs and SDRAMs, those bits of the command to be decoded which are supplied to the command decoder via in each case one external connection are referred to by the designations /CS, /RAS, /CAS and /WE. In the case of SGRAMs, a fifth bit DSF (defined special function) is added.

There are two possibilities for reporting to the memory that it should not carry out any operation (no operation, NOP): firstly, this is the case when /CS=1, with the other command bits not being relevant. Secondly, the memory does not carry out any command when ICS=0 and /RAS=1, /CAS=1, /WE=1 and (in the case of SGRAMs) DSF=0. On the other hand, if /CS=0 and the other command bits have a combination other than 111(0) (the NOP command just explained), the command decoder activates one of the internal command signals. Otherwise, it does not activate any of the internal command signals.

SUMMARY OF THE INVENTION

It is accordingly an object of the invention to provide an integrated circuit with a command decoder, in which none of the outputs of the command decoder are activated either when one of the command bits is at a first level or when that second command bit is at a second level and the other command bits are at levels which correspond to an explicit deactivation command.

With this and other objects in view there is provided, in accordance with the invention, an integrated circuit, comprising:

an activation decoder having a number m command inputs for receiving digital commands of length m bits, wherein one of the digital commands is a deactivation command, an activation input for receiving an activation signal, and m outputs;

a command decoder having a plurality of decoder inputs connected to the outputs of the activation decoder;

the activation decoder, when the activation signal is at a first logic level, outputting at the outputs the command received at the command inputs;

the activation decoder, when the activation signal is at a second logic level, outputting the deactivation command at the outputs irrespective of the command present at the command inputs;

the command decoder having outputs, none of which are activated when the deactivation command is present at the decoder inputs, and one of which is in each case activated by the decoder when a command is present at the decoder inputs different from the deactivation command.

In accordance with an added feature of the invention, a number m command input terminals are each connected to a respective the command input of the activation decoder, and an activation input terminal is connected to the activation input of the activation decoder.

In accordance with a concomitant feature of the invention, there is provided a latching unit that is connected between the outputs of the activation decoder and the decoder inputs of the command decoder, the latching unit having a clock signal input for receiving a clock signal. The latching unit, during each cycle of the clock signal, receives a present command produced at the outputs of the activation decoder, stores the command, and outputs the command to the decoder inputs of the command decoder.

In other words, the integrated circuit according to the invention has an activation decoder to whose inputs the digital commands and an activation signal are supplied. In this case, the activation signal may be in the form of an additional bit of the digital commands. The outputs of the activation decoder are connected to the command decoder. The command decoder has outputs, none of which are activated by said decoder when the deactivation command is being supplied to its inputs, and one of which is in each case activated by said decoder when a different command is supplied to its inputs. When the activation signal is at a first logic level, the activation decoder produces at its outputs the command supplied to it from the command inputs. When the activation signal is at a second logic level, the activation decoder produces the deactivation command at its outputs irrespective of the command supplied to it from the command inputs.

The digital commands are therefore decoded in two stages in the integrated circuit according to the invention. First, the activation decoder checks whether the activation signal is at the second logic level, and in this case produces the deactivation command. Thus, the activation command is supplied from the activation decoder to the command decoder both in the situation just mentioned and when the activation signal is at the first logic level and the digital command supplied via the command inputs is equivalent to the deactivation command. Since the activation decoder is already evaluating the activation signal, only the m bits of the respective command are now supplied to the command decoder, so that it may have a relatively simple design.

The integrated circuit can, for example, be an integrated, synchronous memory such as an SDRAM or SGRAM.

Other features which are considered as characteristic for the invention are set forth in the appended claims.

Although the invention is illustrated and described herein as embodied in an integrated circuit having a command decoder, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is schematic detail of an exemplary embodiment of the integrated circuit; and FIG. 2 is a table illustrating the relationship between the output signals from the circuit in FIG. 1 and its input signals.

DESCRIPTION OF THE PREFERRED EMBODIMENTS

Referring now to the figures of the drawing in detail and first, in particular, to FIG. 1 there is shown an activation decoder ADEC, a latching or hold circuit L (latch) and a command decoder CDEC. The activation decoder ADEC is supplied via four corresponding command inputs with four command bits /RAS, /CAS, /WE, and DSF and, via an activation input, with an activation signal /CS. The exemplary embodiment is a synchronous integrated memory of the SGRAM type. In other exemplary embodiments, in which the circuit is an SDRAM, the fourth command bit DSF is not provided.

The output side of the activation decoder ADEC is connected via the latching circuit L to the command decoder CDEC. The command decoder CDEC has outputs CMDi (CMD1, CMD2, ...), one of which is in each case activated by it depending on the commands supplied to it from the activation decoder ADEC. The outputs CMDi of the command decoder CDEC are connected to in each case one internal command line, to which the command decoder CDEC transmits a corresponding internal command signal when the respective output CMDi is activated. In this case, each integrated command signal corresponds to a specific SGRAM operating mode.

The latching circuit L is clocked by a clock signal CLK. On each positive edge of the clock signal CLK, the latching circuit L accepts the present command produced at the outputs of the activation decoder ADEC, stores the command, and passes it on to the inputs of the command decoder CDEC. It will be understood by those of skill in the art that in other embodiments of the invention, the latching circuit L may also be omitted, so that the activation decoder ADEC is connected directly to the command decoder CDEC. The latching circuit L may also be arranged upstream of the inputs of the activation. decoder ADEC, or downstream from the outputs of the command decoder CDEC.

Whenever a command is supplied to it, the command decoder CDEC in each case activates one of its outputs CMDi, unless a deactivation command DEACT=1110, as shown in the left-hand part of FIG. 1, is being supplied to it. In the last-mentioned situation, the command decoder CDEC does not activate any of its outputs CMDi, so that none of the internal command signals is activated, and the memory does not carry out any operation. Then, the activation decoder ADEC always produces the respective command which is present at its inputs unchanged at its outputs, provided the activation signal is /CS=0. If the command supplied to the memory via its command inputs is then equivalent to the deactivation command, as is shown in FIG. 1, this is also supplied to the command decoder CDEC via the latching circuit L. Provided the activation signal is /CS=1, the activation decoder ADEC produces the deactivation command DEACT=1110 at its outputs irrespective of the present command applied to the command inputs.

Thus, in accordance with the JEDEC specification for SGRAMs, there are two possible ways of reporting to this memory that it should not carry out any operation:

setting the activation signal /CS to a high level, in which case the levels of the command bits /RAS, /CRS, /WE and DSF are irrelevant; and explicitly supplying the deactivation command DEACT via the command inputs while the activation signal /CS is at a low level.

Referring now to FIG. 2, there is shown a part of a table which, from left to right, shows the output signals of the activation decoder ADEC, the activation signal /CS, the command bits /RAS, /CAS, /WE and DSF, and the logic states of the outputs CMDi of the command decoder CDEC. The first two rows of the table show the two possible ways in which the deactivation command DEACT=1110 can be produced at the outputs of the activation decoder ADEC, in response to which the command decoder CDEC does not activate any of its outputs CMDi. By way of example, the third and fourth lines in the table show two input signal combinations, for each of which the command decoder CDEC activates one of its outputs CMDi, that is to say changes it to a high level.

The activation decoder ADEC thus recodes the command supplied to it via the four command inputs to produce the deactivation command, provided /CS=1. The command decoder CDEC is a 1-from-n decoder, which in each case activates one of its outputs CMDi depending on the command supplied to it from the latching circuit L.

We claim:

1. An integrated circuit, comprising:

an activation decoder having a number m command inputs for receiving digital commands of length m bits, wherein one of the digital commands is a deactivation command, an activation input for receiving an activation signal, and m outputs;

a command decoder having a plurality of decoder inputs connected to said outputs of said activation decoder;

said activation decoder, when the activation signal is at a first logic level, outputting at said outputs the command received at said command inputs;

said activation decoder, when the activation signal is at a second logic level, outputting the deactivation command at said outputs irrespective of the command present at said command inputs;

said command decoder having outputs, none of which are activated when the deactivation command is present at said decoder inputs, and one of which is in each case activated by said decoder when a command is present at said decoder inputs different from the deactivation command.

2. The integrated circuit according to claim 1, which comprises a number m command input terminals each connected to a respective said command input of said activation decoder, and an activation input terminal connected to said activation input of said activation decoder.

3. The integrated circuit according to claim 1, which further comprises:

a latching unit connected between said outputs of said activation decoder and said decoder inputs of said command decoder, said latching unit having a clock signal input for receiving a clock signal;

said latching unit, during each cycle of the clock signal, receiving a present command produced at said outputs of said activation decoder, storing the command, and outputting the command to said decoder inputs of said command decoder.

* * * * *